(12) United States Patent
Tanaka (10) Patent No.: US 7,388,297 B2
(45) Date of Patent: Jun. 17, 2008

(54) SEMICONDUCTOR DEVICE WITH REDUCED THICKNESS OF THE SEMICONDUCTOR SUBSTRATE

(75) Inventor: Yasuo Tanaka, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 143 days.

(21) Appl. No.: 11/211,517

(22) Filed: Aug. 26, 2005

(65) Prior Publication Data

US 2007/0045793 A1 Mar. 1, 2007

(51) Int. Cl.
*H01L 23/29* (2006.01)
*H01L 23/28* (2006.01)

(52) U.S. Cl. .................. 257/790; 257/789; 257/787

(58) Field of Classification Search .............. 257/787, 257/789, 790
See application file for complete search history.

(56) References Cited

U.S. PATENT DOCUMENTS 6,353,267 B1  3/2002  Ohuchi et al.
6,562,658 B2  5/2003  Ohuchi et al.
6,699,735 B2  3/2004  Ohuchi et al.
2004/0266139 A1*  12/2004  Shibata .................. 438/465
2006/0273434 A1*  12/2006  Shibata .................. 257/673

FOREIGN PATENT DOCUMENTS

| JP | 09-219421 | | 8/1997 |
| JP | 09219421 | * | 8/1997 |
| JP | 2001-094005 | | 4/2001 |
| JP | 2004-319638 | | 11/2004 |

* cited by examiner

*Primary Examiner*—Kiesha L Rose
(74) *Attorney, Agent, or Firm*—Rabin & Berdo, PC

(57) ABSTRACT

A semiconductor device includes a silicon substrate having first and second surfaces, in which a wiring pattern is formed on the first surface; a first resin layer formed over the first surface of the silicon substrate; and a second resin layer formed over the second surface of the silicon substrate. The silicon substrate has a thickness less than 150 μm, and each of the first and second resin layers has a thickness larger than that of the silicon substrate.

28 Claims, 7 Drawing Sheets

SEMICONDUCTOR DEVICE WITH REDUCED THICKNESS OF THE SEMICONDUCTOR SUBSTRATE

TECHNICAL FIELD OF THE INVENTION

The present invention relates to a semiconductor device and a method for fabricating the same; and more particularly to, a wafer level CSP (Chip Sized Package) and a method for fabricating the same.

BACKGROUND OF THE INVENTION

High density mounting of semiconductor devices has been advancing in recent years, and the main focus has been on semiconductor devices such as CSP (Chip Sized Package).

In a chip-sized-package of semiconductor device, it is important to prevent cracks, which may be generated at a joint section between the semiconductor device and a mounting substrate (printed board) due to differences in the thermal expansion coefficients of the semiconductor elements and the mounting substrate.

A conventional chip size package includes a sealing resin formed on a circuit formation surface of a semiconductor element (substrate) and a surface opposite the circuit formation surface, so that warping of the wafer is prevented.

If a crack were generated at a joint section between a semiconductor device and a circuit board, connection reliability would deteriorate. Connection reliability includes certainty of mechanical and electrical contact between a CSP and a circuit board. In order to improve such connection reliability, certain materials may be filled between a CSP and a circuit board. However, manufacturing cost would be increased.

OBJECTS OF THE INVENTION

Accordingly, an object of the present invention is to provide a semiconductor device in which connection reliability with a circuit board is improved.

Another object of the present invention is to provide a method for manufacturing a semiconductor device having improved connection reliability with a circuit board.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device includes a semiconductor substrate having first and second surfaces, in which a wiring pattern is formed on the first surface; a first resin layer formed over the first surface of the semiconductor substrate; and a second resin layer formed over the second surface of the semiconductor. The semiconductor has a thickness of less than 150 μm, and each of the first and second resin layers has a thickness larger than that of the semiconductor substrate.

The first and second surfaces of the semiconductor substrate are the surfaces opposing to each other, such as upper-and-lower or top-and-bottom. The wiring pattern may include a variety of kinds of conductive material formed on the first surface of the semiconductor substrate. The wiring pattern may be of metal.

A coefficient of linear thermal expansion of silicon is usually about 3 ppm, that of a circuit board is usually about 17 ppm, and that of a resin is usually about 11 ppm. Which means that coefficients of linear thermal expansion of a circuit board and a resin are similar to each other. According to the present invention, the semiconductor substrate has a thickness of less than 150 μm, and each of the first and second resin layers has a thickness larger than that of the semiconductor substrate, therefore, stress generated due to a difference of thermal coefficients between a circuit board and the semiconductor device, mounted on the circuit board can be reduced.

It should be noted that if the thickness of resin layers is too large as compared with that of the semiconductor substrate, stress applied to the semiconductor device could be increased conversely.

According to the present invention, thicknesses of a semiconductor substrate and first and second resin layers, formed on the both surface of the silicon substrate, are optimally determined. As a result, connection reliability between the semiconductor device and a circuit board is improved.

According to a second aspect of the present invention, a method for fabricating a semiconductor device, includes the steps of: providing a semiconductor substrate having first and second surfaces; forming a predetermined wiring pattern on the first surface of the substrate; forming conductive posts on the first surface of the substrate, the conductive posts being electrically connected to the wiring pattern; forming a first resin layer over the first surface of the substrate to cover the conductive posts; removing an upper part of the first resin layer to expose upper ends of the conductive posts; forming conductive bumps on the upper ends of the conductive posts; providing a protection layer over the first resin layer to cover the conductive bumps; grinding the second surface of the substrate to reduce a thickness of the substrate to a predetermined value that is less than 150 μm; removing the protection layer; forming a second resin layer on the second surface of the substrate; and dicing the substrate to form individual CSP (Chip Sized Package). The thickness of the substrate is not larger than the first and second resin layers.

In the method according to the second aspect of the present invention, the following additional limitations can be applied:

1) The semiconductor substrate has a thickness of 40 to 100 μm.

2) The semiconductor substrate has a thickness of 50 to 60 μm.

3) The ratio in thickness between the semiconductor substrate and the first and second resin layers is 1:2.

4) The ratio in thickness between the semiconductor substrate and the first and second resin layers is not larger than 1:3.

5) The second resin layer has a coefficient of linear thermal expansion that is 7 to 15 ppm.

6) The second resin layer has a coefficient of linear thermal expansion that is 9 to 12 ppm.

7) The second resin layer has a coefficient of linear thermal expansion that is about 11 ppm.

8) The second resin layer has an elastic modulus of 10 to 22 Gpa.

9) The second resin layer has an elastic modulus of 15 to 20 Gpa.

10) The second resin layer has an elastic modulus of about 18 Gpa.

11) The first resin layer has a coefficient of linear thermal expansion that is of 7 to 12 ppm.

12) The first resin layer has an elastic modulus of 1 to 20 Gpa.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
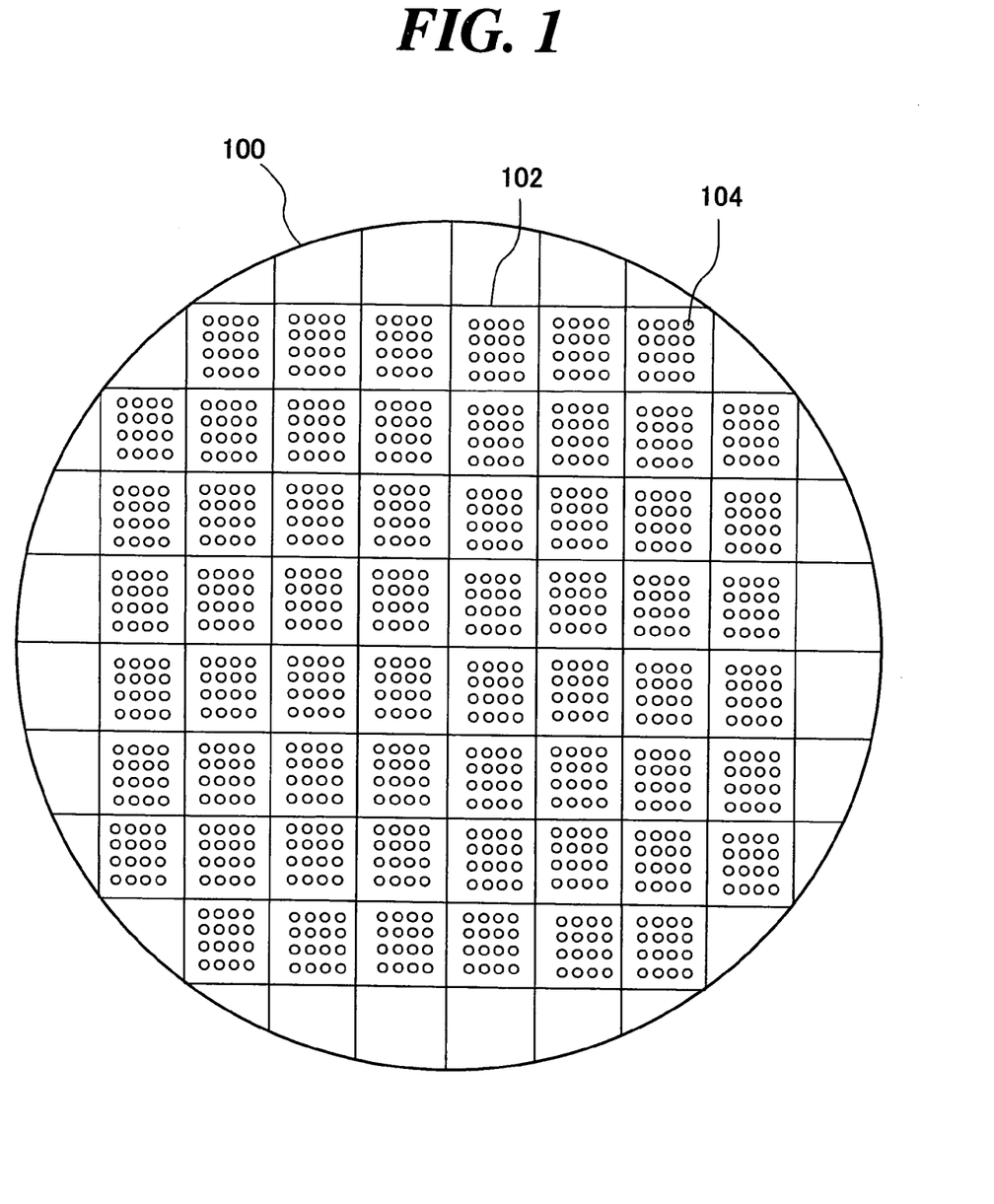
FIG. 1 is a plane view showing a semiconductor wafer which is applicable to the present invention.

First, referring to FIG. 1, a semiconductor wafer 100 includes a number of semiconductor devices 102, which are to be separated along scribe lines. Each of the semiconductor devices 102 is of a wafer-level CSP (Chip Sized Package). Each of the semiconductor devices 102 is provided with external terminals 104 thereon, which are to be electrically connected to a circuit pattern formed on a circuit board, which is not shown in the drawings.

Figure 2:
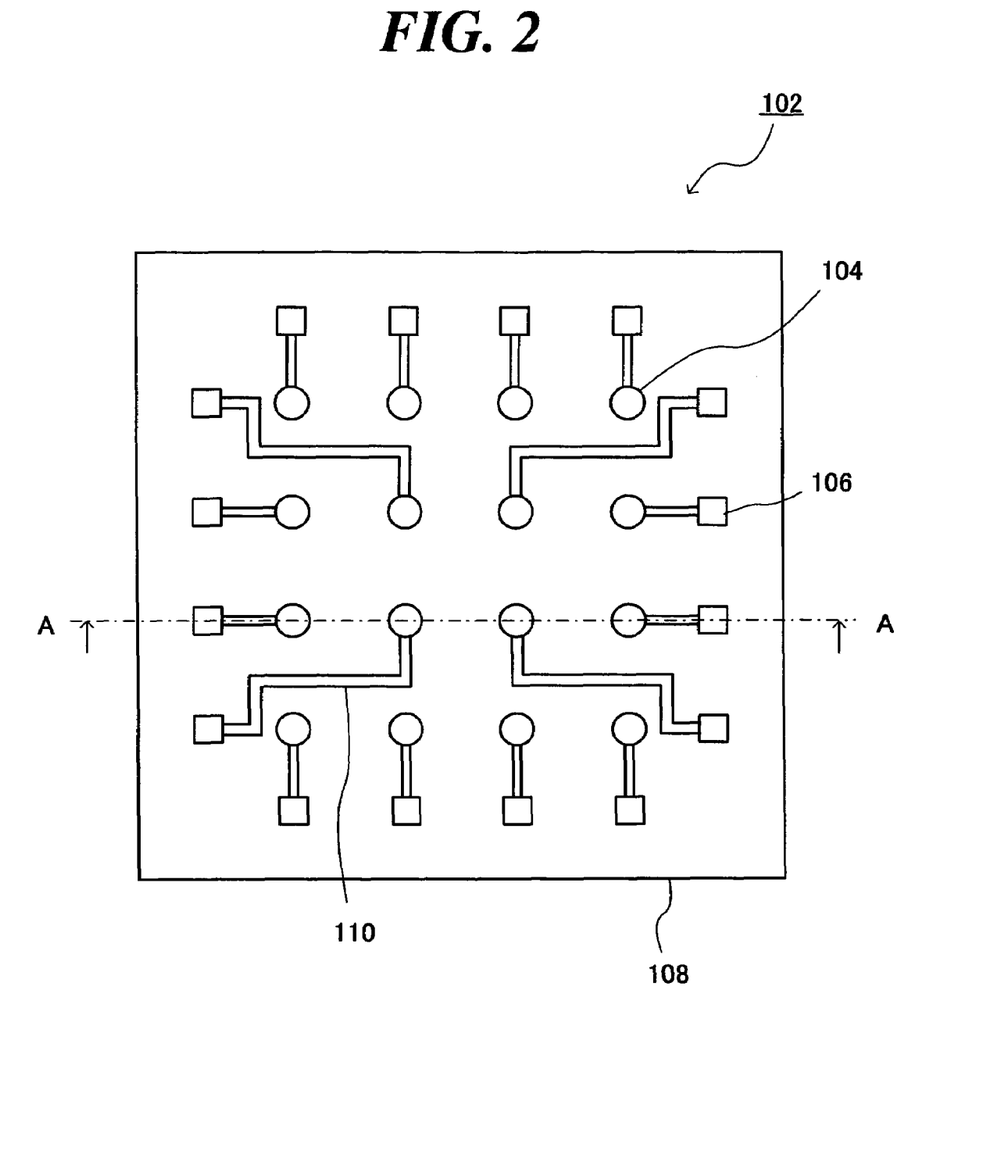
FIG. 2 is a plane view showing a CSP according to the present invention.
Figure 3:
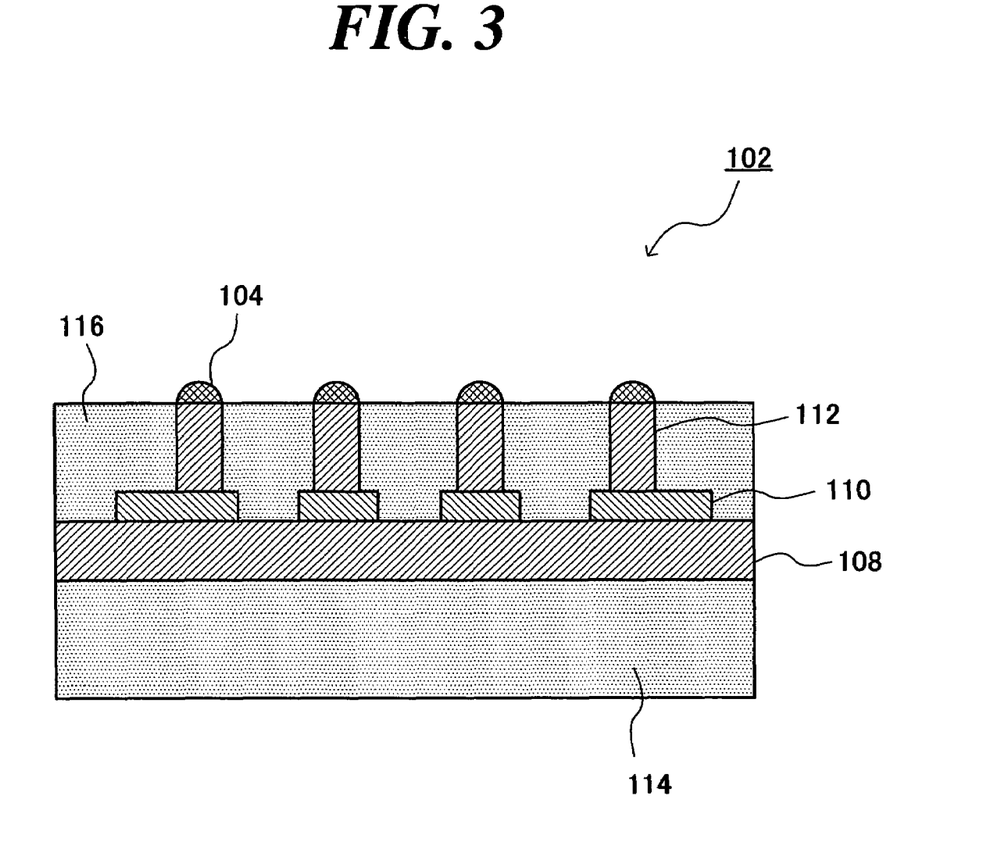
FIG. 3 is a cross-sectional view taken on line A-A in FIG. 2.

Now, referring to FIGS. 2 and 3, each of the semiconductor devices 102 includes a silicon substrate (or semiconductor chip) 108, electrode pads 106, a wiring pattern 110 and the external terminals 104. The wiring pattern 110, which may be made of copper, and the external terminals 104, are connected by conductive posts 112, which may also be made of copper. The wiring pattern 110 can also be called "redistribution wiring". The silicon substrate 108 may be shaped as a square but is not limited to a square. The external terminals 104 may be solder bumps. Sixteen electrode pads 106 are arranged along the peripheral side lines of the silicon substrate 108 with a predetermined interval or space from each other. In a plane view, sixteen external terminals 104 are formed in a grid like arrangement.

The silicon substrate 108 has first and second surfaces, in which the wiring pattern 110 is formed on the first surface. The semiconductor device 102 further includes a first resin layer 116 formed over the first surface of the silicon substrate 108; and a second resin layer 114 formed over the second surface of the silicon substrate 108. The first and second resin layers 116 and 114 are of a thermosetting epoxy resin.

The silicon substrate 108 is formed to have a thickness of less than 150 μm, and each of the first and second resin layers 116 and 114 has a thickness larger than that of the silicon substrate 108. Preferably, the silicon substrate 108 has a thickness of 40-100 μm and more preferably, 50-60 μm. When the silicon substrate 108 has a thickness of 50 μm, the first and second resin layers 116 and 114 may have a thickness of about 90 μm.

The ratio in thickness between the silicon substrate 108 and the first and second resin layers may be 1:2 (one to two), but not larger than 1:3 (one to three).

The second resin layer 114 has a coefficient of linear thermal expansion that is 7 to 15 ppm, preferably, 9 to 12 ppm, and more preferably, about 11 ppm. The second resin layer 114 has an elastic modulus of 10 to 22 Gpa, preferably, 15 to 20 Gpa, and more preferably, about 18 Gpa. On the other hand, the first resin layer has a coefficient of linear thermal expansion that is of 7 to 12 ppm, and has an elastic modulus of 1 to 20 Gpa.

Figure 4A:
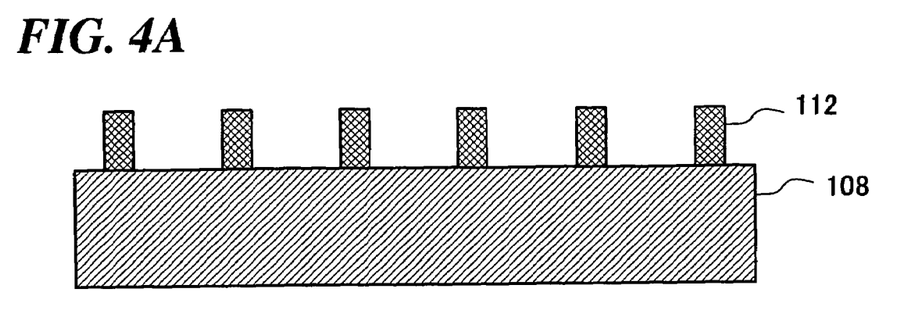
FIGS. 4A-4H are cross-sectional views showing fabrication steps of a CSP according to the present invention.

Next, fabrication process of the CSP 102 according to the present invention is described in connection with FIGS. 4A-4H. A silicon substrate (wafer) 108 having a wiring pattern (110) on its first surface is prepared. In FIGS. 4A-4H, the wiring pattern 110 and electrode pads 106 are not shown for easy understanding of fabrication steps. As shown in FIG. 4A, copper posts 112 are formed on the first surface of the silicon substrate 108 by electroplating or the like, so that the conductive posts 112 are electrically connected to the wiring pattern (110). The silicon substrate 108 at this stage may have a thickness, for example, of about 120 to 200 μm.

Figure 4B:
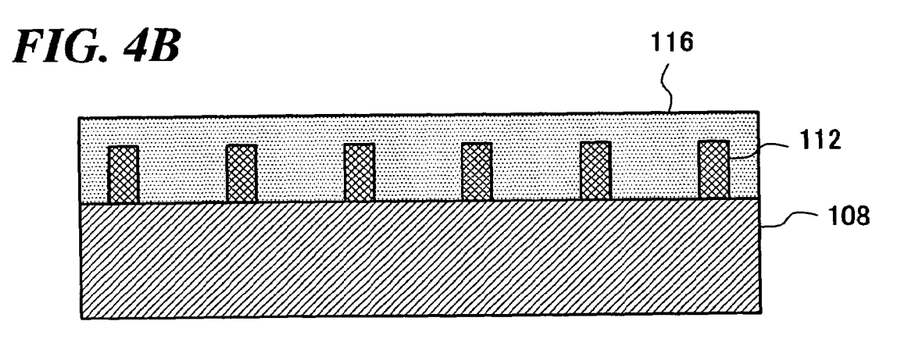

Subsequently, the first surface of the silicon substrate 108 and the copper posts 112 are sealed with first resin 116, as shown in FIG. 4B, by a transfer molding process, a potting process or printing process, etc. The thickness of the first resin 116 is larger than that of the copper posts 112, which may be about 90 μm. The resin layer 116 is formed in order to relieve stress applied to the silicon substrate 108 and to prevent scratching of the silicon substrate 108.

Figure 4C:
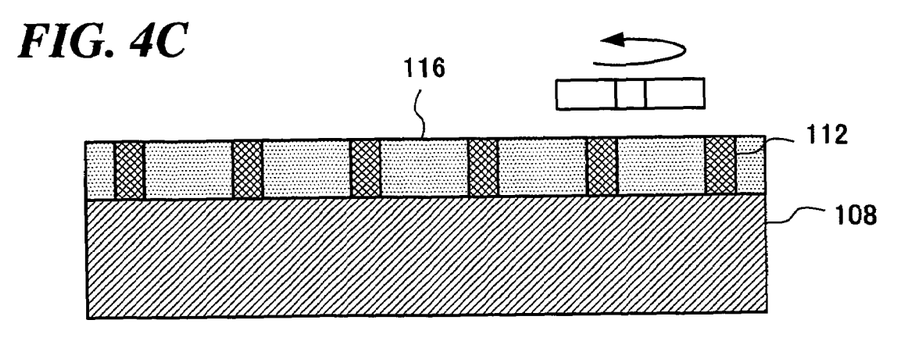
Figure 4D:
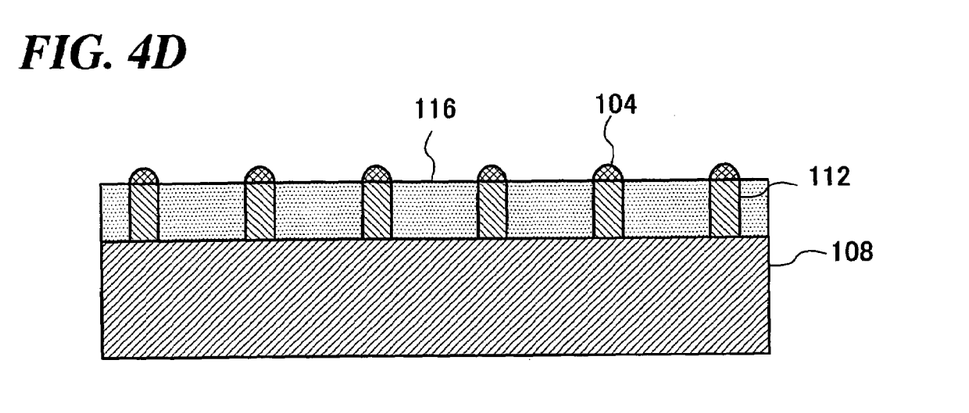

Next, as shown in FIG. 4C, an upper part of the first resin layer 116 is ground and removed until upper ends of the copper posts 112 are exposed. After that, a solder bump 104 is formed on the exposed upper end of each copper posts 112.

Figure 4E:
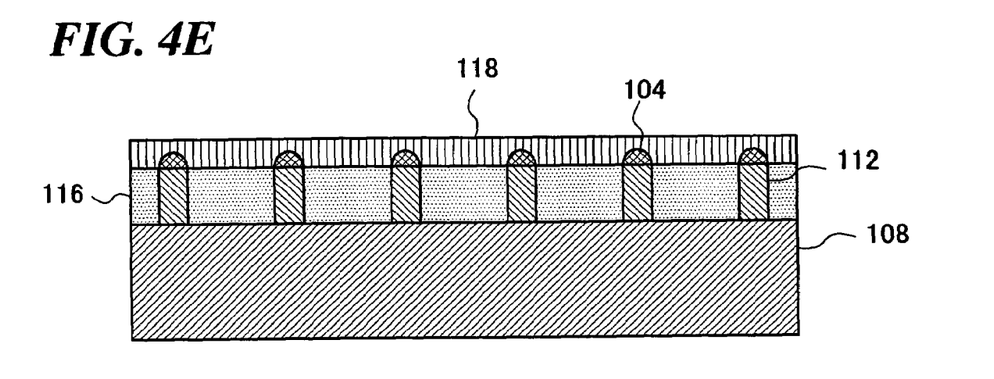

As shown in FIG. 4E, subsequently, a protection layer 118 is formed over the first resin layer 116 to cover the solder bumps 104. The protection layer 118 may be of a tape having thermal resistance, such as PET, polyolefine, polyester or the like. The protection layer 118 may also be a glass plate. The protection layer 118 is formed with an acrylic adhesive to fill up concave-convex portions on the first resin layer 116 and flatten it to provide a better contact with the protection layer 118. The protection layer 118 is used only for the following process of grinding.

Figure 4F:
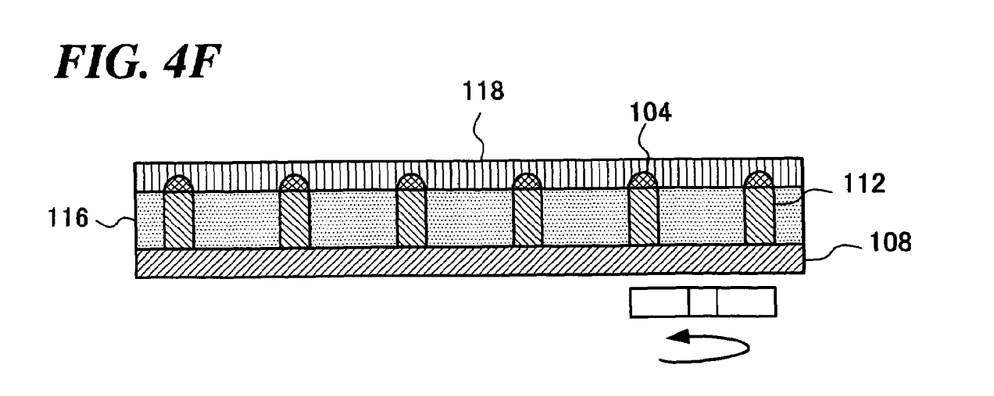
Figure 4G:
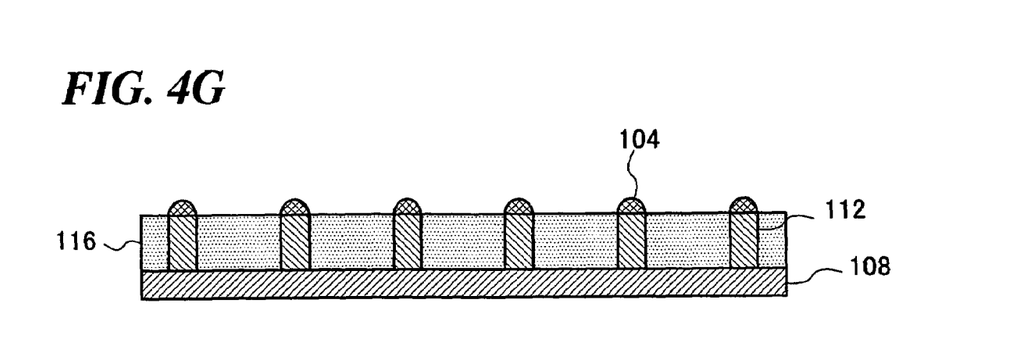

Next, as shown in FIG. 4F, the second surface of the silicon substrate 108 are ground until the substrate 108 has a thickness of about 50 μm. After the silicon substrate 108 is ground, the protection layer 118 is removed together with the adhesive, as shown in FIG. 4G.

Figure 4H:
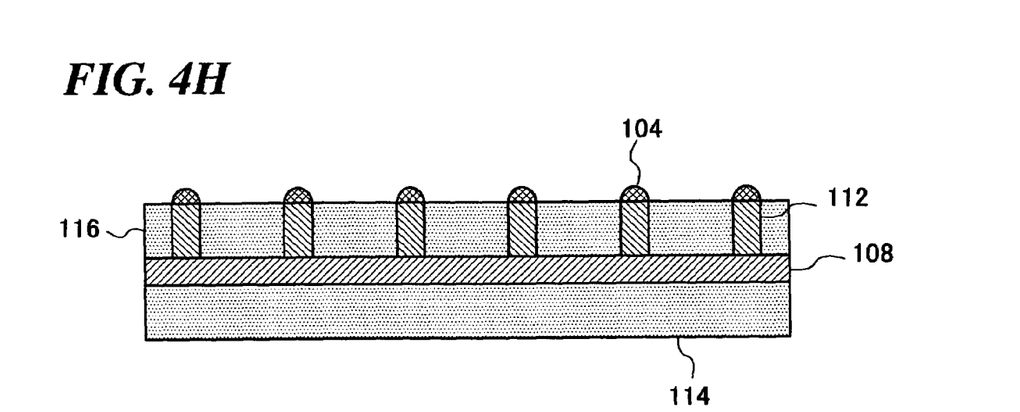

Subsequently, as shown in FIG. 4H, a second resin layer 114 is formed on the second (bottom) surface of the silicon substrate 108 to have a thickness about 90 μm. After that, each individual semiconductor device 102 is divided from the semiconductor wafer 100 in a dicing process.

Figure 5:
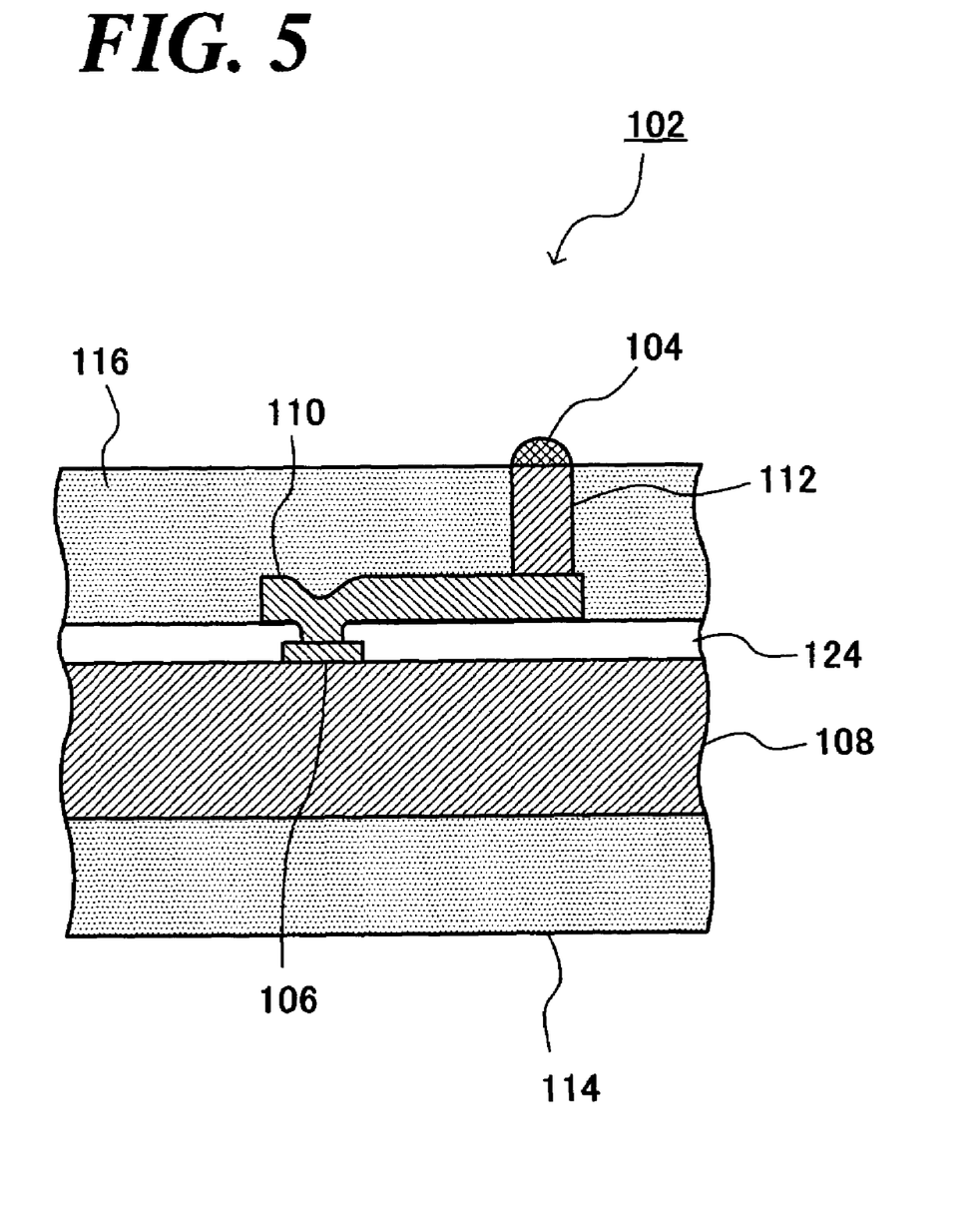
FIG. 5 is a cross-sectional view showing a part of CSP according to the present invention.

FIG. 5 is a cross-sectional view showing a part of CSP according to the present invention, which illustrates more detail of the CSP than FIG. 3. In FIG. 5, the same and corresponding components to those in FIGS. 1-4 are represented by the same reference numerals and the same description is not repeated. Which means that the same materials, same fabrications steps and same designs as described above can be applied to the structure shown in FIG. 5.

As shown in FIG. 5, a CSP includes a silicon substrate 108 having first and second surfaces, in which an electrode pad 106 is formed on the first surface; an insulating film 124 formed on the first surface so as to expose a part of the electrode pad 106; a wiring pattern 110, which can be called redistribution wiring, extending from the electrode pad 106 to the upper surface of the insulating film 124; a conductive member 112 formed on a part of the wiring pattern 110; a first resin layer 116 formed over the first surface of the semiconductor substrate 108 so as to cover the wiring pattern 110 and a side surface of the conductive member 112; and a second resin layer 114 formed over the second surface of the semiconductor substrate 108. The semiconductor substrate 108 has a thickness of less than 150 µm, and each of the first and second resin layers 116 and 114 has a thickness larger than that of the semiconductor substrate 108.

Preferably, the silicon substrate 108 has a thickness of 40-100 µm and more preferably, 50-60 µm. When the silicon substrate 108 has a thickness of 50 µm, the first and second resin layers 116 and 114 may have a thickness of about 90 µm.

The ratio in thickness between the silicon substrate 108 and the first and second resin layers may be 1:2 (one to two), but not larger than 1:3 (one to three).

The second resin layer 114 has a coefficient of linear thermal expansion that is 7 to 15 ppm, preferably, 9 to 12 ppm, and more preferably, about 11 ppm. The second resin layer 114 has an elastic modulus of 10 to 22 Gpa, preferably, 15 to 20 Gpa, and more preferably, about 18 Gpa. On the other hand, the first resin layer has a coefficient of linear thermal expansion that is of 7 to 12 ppm, and has an elastic modulus of 1 to 20 Gpa.

What is claimed is:

1. A semiconductor device, comprising:
    a semiconductor substrate having first and second surfaces, in which a wiring pattern is formed on the first surface;
    a first resin layer formed over the first surface of the semiconductor substrate; and
    a second resin layer formed over the second surface of the semiconductor substrate, wherein
    the semiconductor substrate has a thickness of less than 150 µm, and each of the first and second resin layers has a thickness larger than that of the semiconductor substrate.

2. A semiconductor device according to claim 1, wherein the semiconductor device is of a CSP (Chip Sized Package).

3. A semiconductor device according to claim 1, wherein the semiconductor substrate has a thickness of 40 to 100 µm.

4. A semiconductor device according to claim 1, wherein the semiconductor substrate has a thickness of 50 to 60 µm.

5. A semiconductor device according to claim 1, wherein the ratio in thickness between the semiconductor substrate and the first and second resin layers is 1:2.

6. A semiconductor device according to claim 1, wherein the ratio in thickness between the semiconductor substrate and the first and second resin layers is not larger than 1:3.

7. A semiconductor device according to claim 1, wherein the second resin layer has a coefficient of linear thermal expansion that is 7 to 15 ppm.

8. A semiconductor device according to claim 1, wherein the second resin layer has a coefficient of linear thermal expansion that is 9 to 12 ppm.

9. A semiconductor device according to claim 1, wherein the second resin layer has a coefficient of linear thermal expansion that is about 11 ppm.

10. A semiconductor device according to claim 1, wherein the second resin layer has an elastic modulus of 10 to 22 Gpa.

11. A semiconductor device according to claim 1, wherein the second resin layer has an elastic modulus of 15 to 20 Gpa.

12. A semiconductor device according to claim 1, wherein the second resin layer has an elastic modulus of about 18 Gpa.

13. A semiconductor device according to claim 1, wherein the first resin layer has a coefficient of linear thermal expansion that is of 7 to 12 ppm.

14. A semiconductor device according to claim 1, wherein the first resin layer has an elastic modulus of 1 to 20 Gpa.

15. A semiconductor device, comprising:
    a semiconductor substrate having first and second surfaces, in which an electrode pad is formed on the first surface;
    an insulating film formed on the first surface so as to expose a part of the electrode pad;
    a wiring pattern extending from the electrode pad to the upper surface of the insulating film;
    a conductive member formed on a part of the wiring pattern;
    a first resin layer formed over the first surface of the semiconductor substrate so as to cover the wiring pattern and a side surface of the conductive member; and
    a second resin layer formed over the second surface of the semiconductor substrate;
    wherein the semiconductor substrate has a thickness of less than 150 µm, and each of the first and second resin layers has a thickness larger than that of the semiconductor substrate.

16. A semiconductor device according to claim 15, wherein the semiconductor device is of a CSP (Chip Sized Package).

17. A semiconductor device according to claim 15, wherein the semiconductor substrate has a thickness of 40 to 100 µm.

18. A semiconductor device according to claim 15, wherein the semiconductor substrate has a thickness of 50 to 60 µm.

19. A semiconductor device according to claim 1, wherein the ratio in thickness between the semiconductor substrate and the first and second resin layers is 1:2.

20. A semiconductor device according to claim 15, wherein the ratio in thickness between the semiconductor substrate and the first and second resin layers is not larger than 1:3.

21. A semiconductor device according to claim 15, wherein the second resin layer has a coefficient of linear thermal expansion that is 7 to 15 ppm.

22. A semiconductor device according to claim 15, wherein the second resin layer has a coefficient of linear thermal expansion that is 9 to 12 ppm.

23. A semiconductor device according to claim 15, wherein the second resin layer has a coefficient of linear thermal expansion that is about 11 ppm.

24. A semiconductor device according to claim 15, wherein the second resin layer has an elastic modulus of 10 to 22 Gpa.

25. A semiconductor device according to claim 16, wherein the second resin layer has an elastic modulus of 15 to 20 Gpa.

26. A semiconductor device according to claim 17, wherein the second resin layer has an elastic modulus of about 18 Gpa.

27. A semiconductor device according to claim 15, wherein the first resin layer has a coefficient of linear thermal expansion that is of 7 to 12 ppm.

28. A semiconductor device according to claim 15, wherein the first resin layer has an elastic modulus of 1 to 20 Gpa.

\* \* \* \* \*